(12) United States Patent
Chien

(10) Patent No.: US 9,065,020 B2
(45) Date of Patent: Jun. 23, 2015

(54) SEMICONDUCTOR LIGHTING MODULE PACKAGE

(75) Inventor: Ko-Wei Chien, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 730 days.

(21) Appl. No.: 12/891,815

(22) Filed: Sep. 28, 2010

(65) Prior Publication Data

US 2011/0186888 A1    Aug. 4, 2011

(30) Foreign Application Priority Data

Feb. 3, 2010    (TW) .............................. 99103137 A

(51) Int. Cl.
*H01L 33/00*    (2010.01)
*H01L 33/46*    (2010.01)

(52) U.S. Cl.
CPC .......... *H01L 33/46* (2013.01); *H01L 2924/0002* (2013.01); *H01L 2224/48091* (2013.01)

(58) Field of Classification Search
CPC ........ H01L 33/60; H01L 33/46; H01L 33/405
USPC ............................ 257/98, E33.066, E33.067, 257/E33.071–E33.074; 362/348, 336
See application file for complete search history.

(56) References Cited

U.S. PATENT DOCUMENTS

| 6,066,861 | A | * | 5/2000 | Hohn et al. .................... 257/99 |
| 8,324,648 | B2 | | 12/2012 | Chien |
| 2004/0160169 | A1 | * | 8/2004 | Van Tongeren ............... 313/504 |
| 2006/0170335 | A1 | | 8/2006 | Cho et al. |
| 2009/0267104 | A1 | * | 10/2009 | Hsu et al. ........................ 257/99 |

FOREIGN PATENT DOCUMENTS

| CN | 102194960 A | 9/2011 |
| TW | 200945622 | 11/2009 |

* cited by examiner

*Primary Examiner* — Laura Menz
*Assistant Examiner* — Candice Y Chan
(74) *Attorney, Agent, or Firm* — Novak Druce Connolly Bove + Quigg LLP

(57) ABSTRACT

A semiconductor lighting module package comprises a substrate, a lead frame, at least one semiconductor lighting element, and a plurality of nanoscale reflectors formed on the substrate and the lead frame for increasing reflection efficiency of the lighting module package. A pitch between every two of the plurality of nanoscale reflectors has a distance P which is shorter than a half wavelength of the visible light. Moreover, a gap between every two of the plurality of the nanoscale reflectors has a depth H, and a ratio of the depth H over the distance P is not less than 2. The distance P is between 90 nm and 130 nm. Furthermore, the light generated by the semiconductor lighting element has at least a part which is reflected by the nanoscale reflectors.

8 Claims, 15 Drawing Sheets

SEMICONDUCTOR LIGHTING MODULE PACKAGE

BACKGROUND

1. Technical Field

The present disclosure generally relates to semiconductor lighting module packages, and particularly to a semiconductor lighting module package with nanoscale reflector.

2. Description of the Related Art

Semiconductor lighting modules have many advantages, such as high luminosity, low operational voltage, low power consumption, compatibility with integrated circuits, easy driving, long-term reliability, and environmental friendliness, which have promoted the semiconductor lighting modules as a widely used light source.

Reflection of commonly used semiconductor lighting modules is not good due to light absorption, such that light extraction of the semiconductor lighting modules is reduced.

What is needed, therefore, is a semiconductor lighting module which can avoid reduction of the light extraction, and ameliorate the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the semiconductor lighting module package. Moreover, in the drawings, like reference numerals designate corresponding parts throughout the views.

DETAILED DESCRIPTION

Embodiments of a semiconductor lighting module package as disclosed are described in detail herewith reference to the drawings.

Figure 1A:
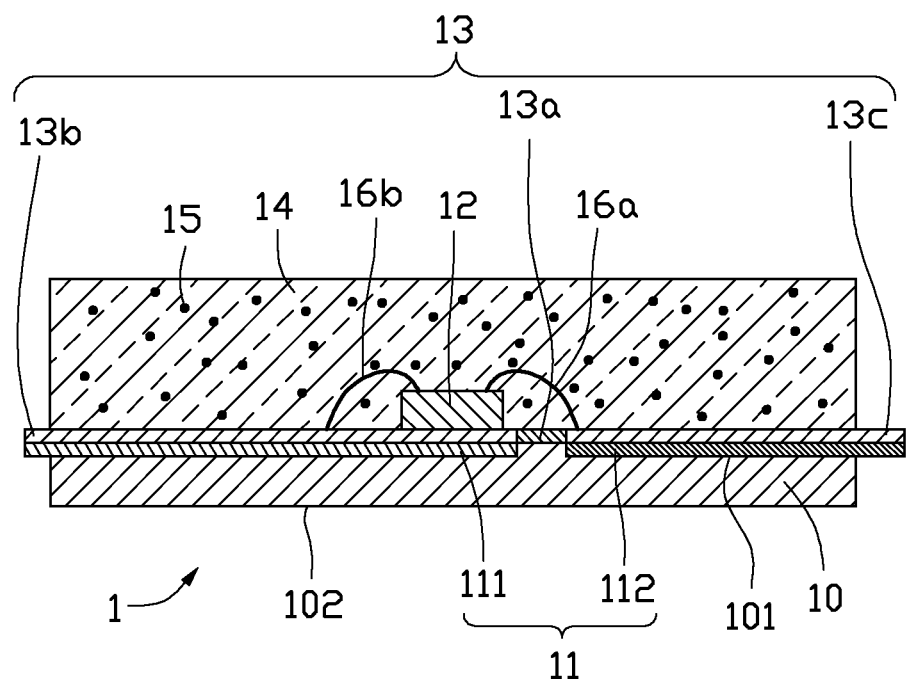
FIG. 1A is a schematic cross section of a semiconductor lighting module package in accordance with a first embodiment of the present disclosure.
Figure 1B:
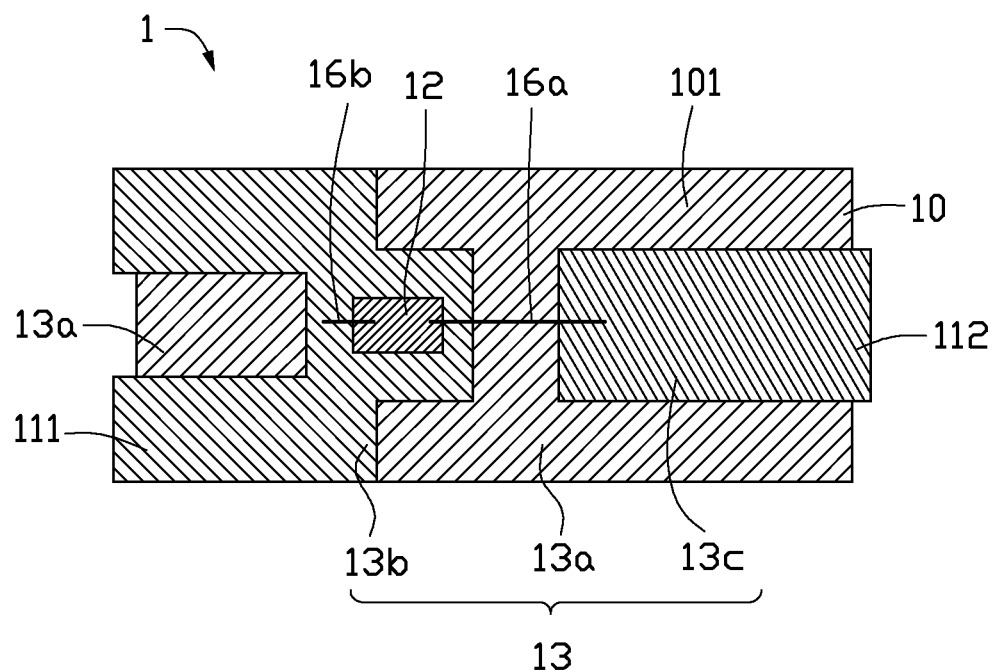
FIG. 1B is a schematic top view of the semiconductor lighting module package in accordance with the first embodiment, with a cover layer thereof being removed for clarity.

Referring to FIGS. 1A and 1B, a semiconductor lighting module package 1 in accordance with a first embodiment includes a substrate 10, a lead frame 11, a semiconductor lighting element 12, and a plurality of nanoscale reflectors 13. The substrate 10 includes a first surface 101 and a second surface 102 arranged oppositely on the two sides of the substrate 10. The substrate 10 can be plastic, polymer, ceramic, silicon, metal, or a combination thereof.

The lead frame 11 is arranged on the first surface 101 of the substrate 10 including a carrier portion 111 and a connecting portion 112. The carrier portion 111 is electrically insulated from the connecting portion 112. The lead frame 11 is made of copper or other electrically conductive metal and is not limited to the shape shown in this embodiment.

The semiconductor lighting element 12 is arranged on the carrier portion 111 of the lead frame 11 and electrically connecting to the connecting portion 112 and the carrier portion 111 separately with metal wires 16a and 16b. The semiconductor lighting element 12 emits light of at least one first wavelength. The semiconductor lighting element 12 can be a light emitting diode, organic light emitting diode, or laser diode.

The plurality of nanoscale reflectors 13 is arranged separately on the first surface 101 of the substrate 10 and the lead frame 11 and can be aluminum or titanium formed by electron beam lithography or photolithography. In this embodiment, a plurality of first nanoscale reflectors 13a is arranged on the first surface 101 of the substrate 10, a plurality of second nanoscale reflectors 13b is arranged on the carrier portion 111 of the lead frame 11, and a plurality of third nanoscale reflectors 13c is arranged on the connecting portion 112 of the lead frame 11.

Figure 2A:
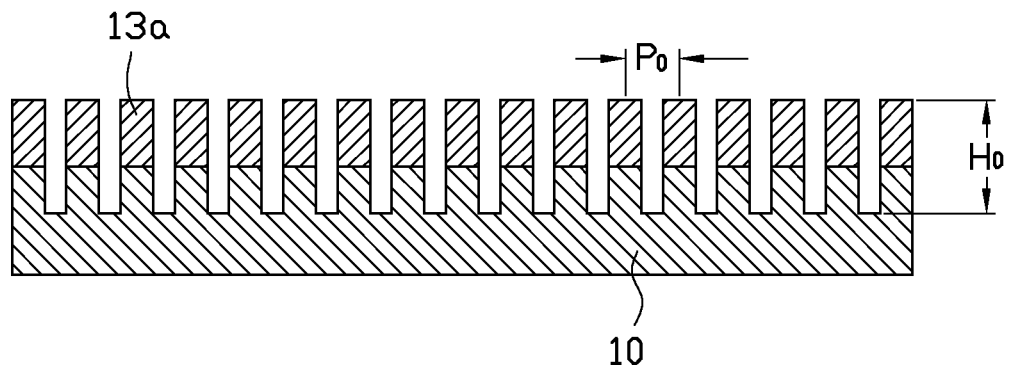
FIGS. 2A to 2C are schematic cross sections of a plurality of nanoscale reflectors of the semiconductor lighting module package of FIG. 1A.
Figure 2B:
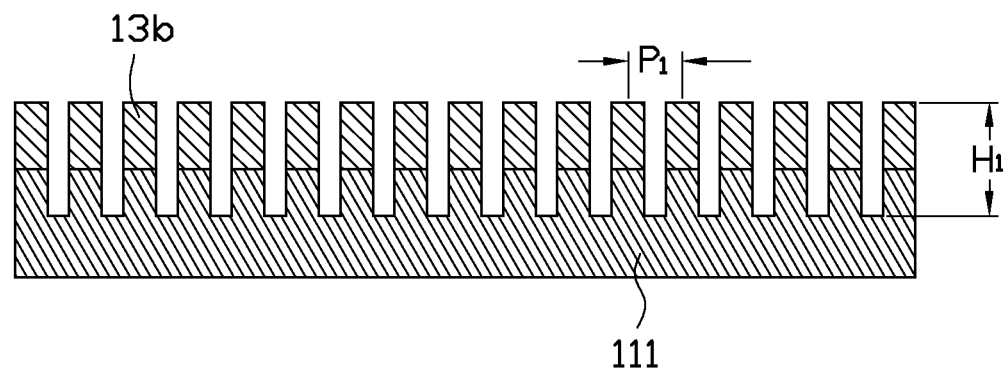
Figure 2C:
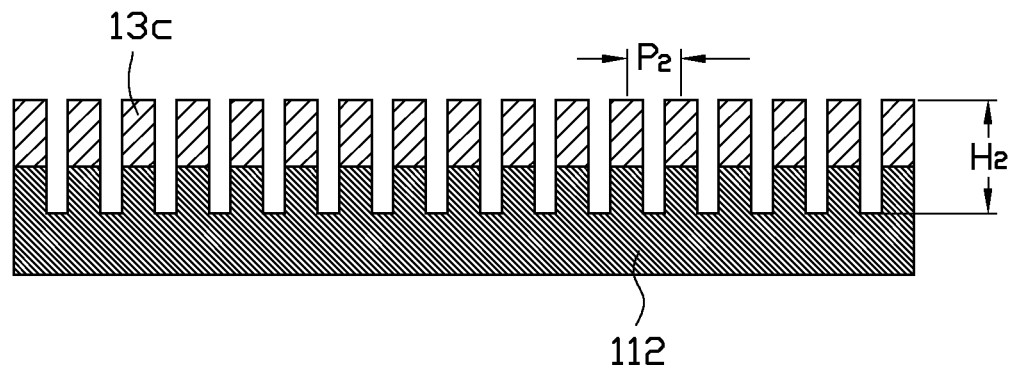
Figure 3A:
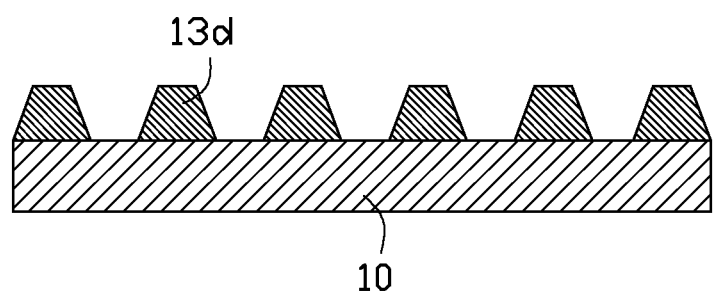
FIGS. 3A to 3F are schematic cross sections of a plurality of nanoscale reflectors with modified structures.
Figure 3B:
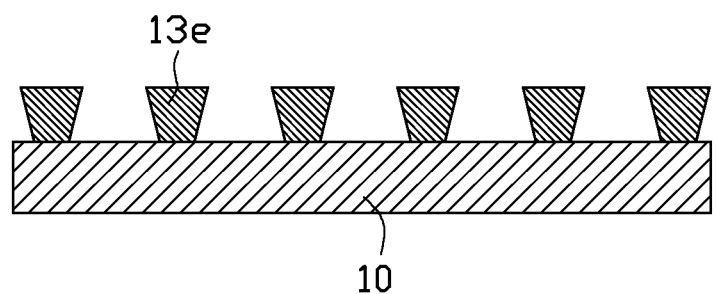
Figure 3C:
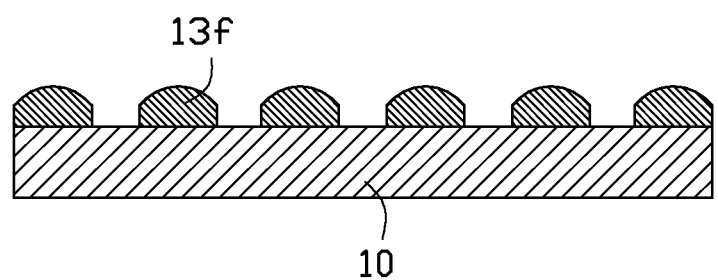
Figure 3D:
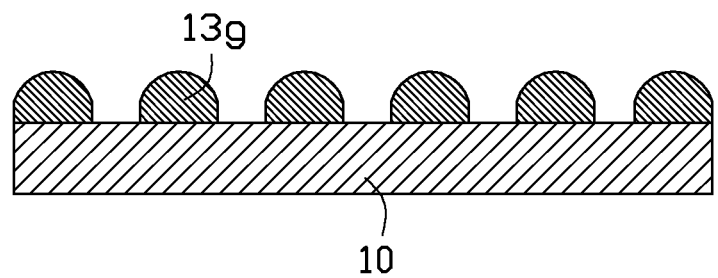
Figure 3E:
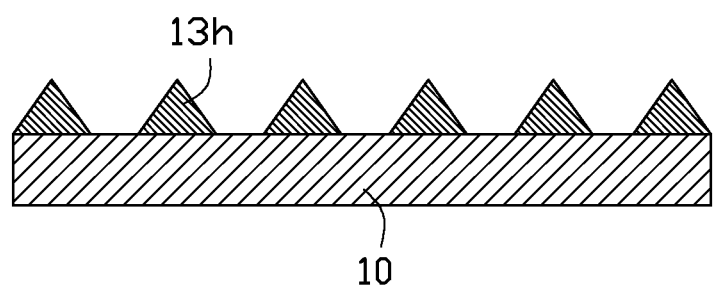
Figure 3F:
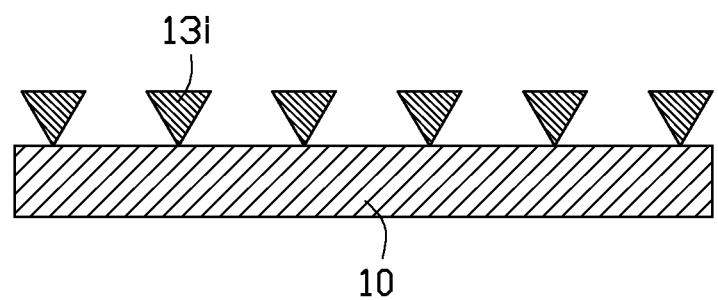

Referring to FIGS. 2A to 2C, the plurality of first nanoscale reflectors 13a is arranged on the substrate 10 with a pitch between every two of the plurality of first nanoscale reflectors 13a having a distance $P_0$ and a gap between every two of the plurality of first nanoscale reflectors 13a having a depth $H_0$. The plurality of second nanoscale reflectors 13b is arranged on the carrier portion 111 with a pitch between every two of the plurality of second nanoscale reflectors 13b having a distance $P_1$ and a gap between every two of the plurality of second nanoscale reflectors 13b having a depth $H_1$. The plurality of third nanoscale reflectors 13c is arranged on the connecting portion 112 with a pitch between every two of the plurality of third nanoscale reflectors 13c having a distance $P_2$ and a gap between every two of the plurality of third nanoscale reflectors 13c having a depth $H_2$. In this embodiment, the distance $P_0$, $P_1$, $P_2$ are all less than a half wavelength of the visible light and are 90 nm to 130 nm preferably. And a ratio of the depth $H_0$, $H_1$, $H_2$ over the distance $P_0$, $P_1$, $P_2$ respectively is not less than 2. The nanoscale reflectors 13a, 13b, 13c are capable of performing subwavelength grating and the spacing of each of the gaps is less than half the wavelength of the visible light. The light generated by the semiconductor lighting element 12 has at least a part which is reflected by the nanoscale reflectors 13a, 13b, 13c. Each of the nanoscale reflectors 13a, 13b, 13c has a reflective index exceeding that of each of the substrate 10 and the lead frame 11.

Referring to FIGS. 3A to 3F, different nanoscale reflectors 13d to 13i are provided which are sequentially trapezoid, inverted trapezoid, elliptical, semicircular, pyramidical, inverted pyramidical. The nanoscale reflectors are rectangular in FIGS. 2A to 2C. The nanoscale reflectors can be at least one shape mentioned above or a combination thereof and not limited to them.

Figure 4A:
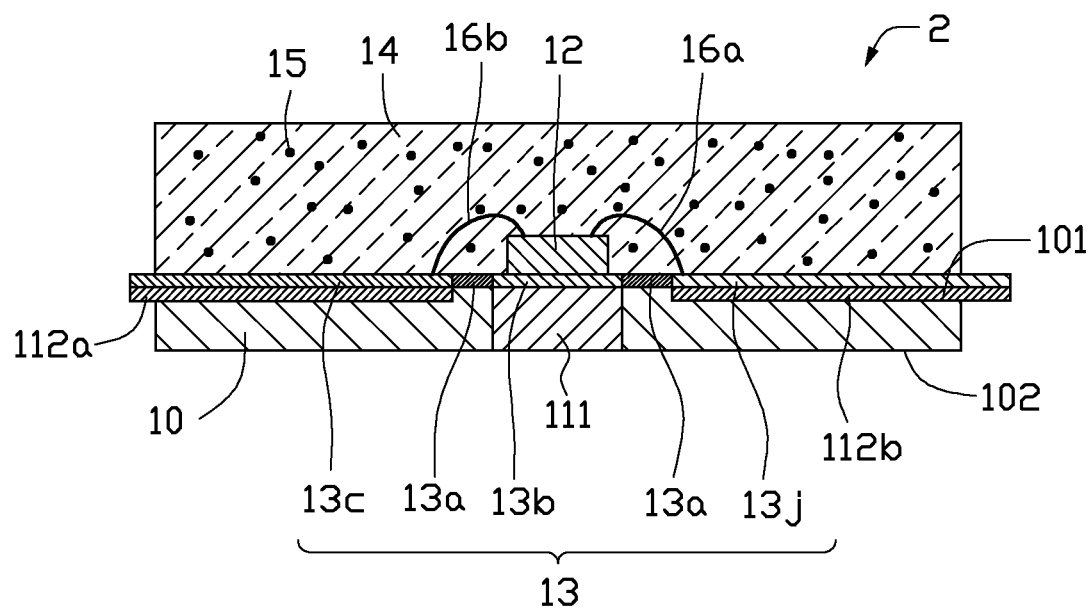
FIG. 4A is a schematic cross section of a semiconductor lighting module package in accordance with a second embodiment.
Figure 4B:
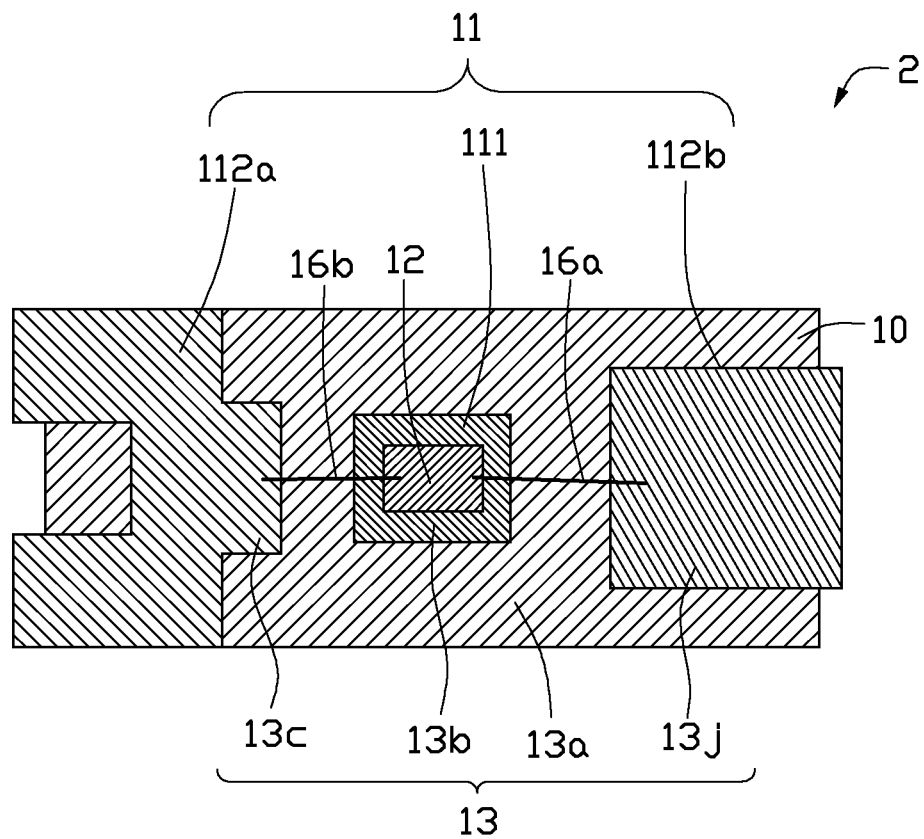
FIG. 4B is a schematic top view of the semiconductor lighting module package in accordance with the second embodiment, with a cover layer thereof being removed for clarity.

Referring to FIGS. 4A and 4B, a semiconductor lighting module package 2 in accordance with a second embodiment includes a substrate 10, a lead frame 11, a semiconductor lighting element 12, and a plurality of nanoscale reflectors 13. The substrate 10 includes a first surface 101 and a second surface 102 arranged oppositely on the two sides of the substrate 10.

The lead frame 11 is arranged on the first surface 101 of the substrate 10 including a carrier portion 111, a first connecting portion 112a, and a second connecting portion 112b. The carrier portion 111, the first connecting portion 112a, and the second connecting portion 112b are electrically insulating with each other. The lead frame 11 is made of copper or other electrically conductive metal and is not limited to the shape of this embodiment.

The semiconductor lighting element 12 is arranged on the carrier portion 111 of the lead frame 11 and electrically connecting to the second connecting portion 112b and the first connecting portion 112a separately with metal wires 16a and 16b. The semiconductor lighting element 12 emits light of at least one first wavelength. The semiconductor lighting element 12 can be light emitting diode, organic light emitting diode, or laser diode. The difference between the semiconductor lighting module packages 1 and 2 is that the lead frame 11 in the semiconductor lighting module package 2 is a structure of different thermal and electrical conduction pathway. The heat of the semiconductor lighting element 12 of the semiconductor lighting module package 2 is dissipated mainly through the carrier portion 111.

The plurality of nanoscale reflectors 13 is arranged separately on the first surface 101 of the substrate 10 and the lead frame 11 by electron beam lithography or photolithography. In this embodiment, a plurality of first nanoscale reflectors 13a is arranged on the first surface 101 of the substrate 10, a plurality of second nanoscale reflectors 13b is arranged on the carrier portion 111 of the lead frame 11, a plurality of third nanoscale reflectors 13c is arranged on the first connecting portion 112a of the lead frame 11, and a plurality of fourth nanoscale reflectors 13j is arranged on the second connecting portion 112b of the lead frame 11.

Figure 5:
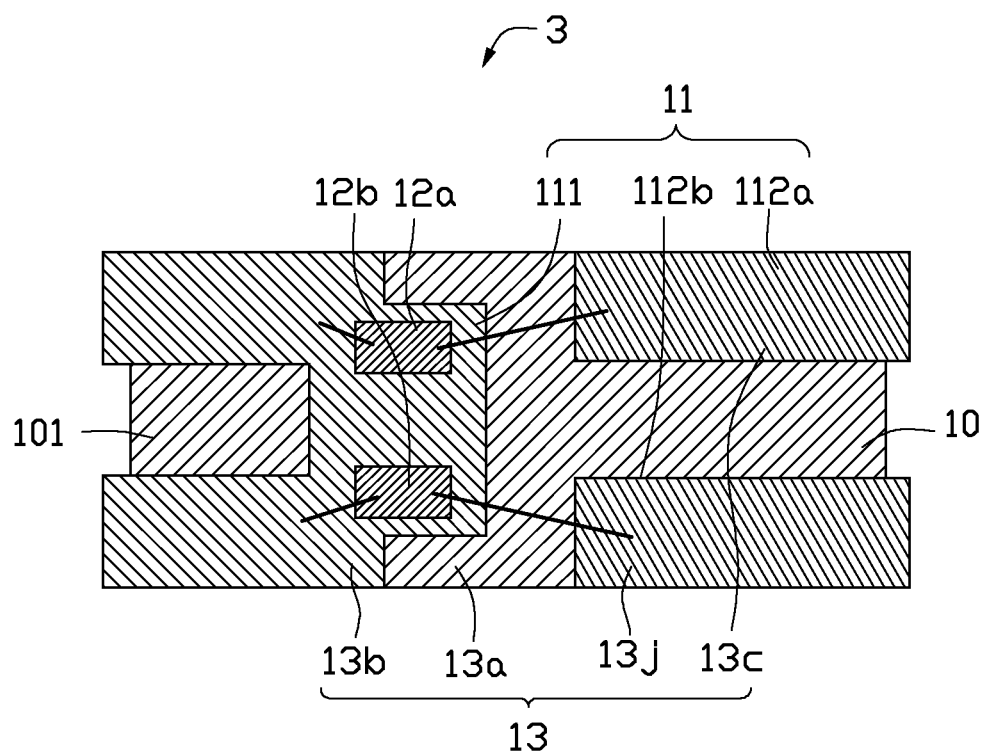
FIG. 5 is a view similar to FIG. 4B, showing a semiconductor lighting module package in accordance with a third embodiment.

Referring to FIG. 5, a semiconductor lighting module package 3 in accordance with a third embodiment includes a substrate 10, a lead frame 11, a first semiconductor lighting element 12a, a second semiconductor lighting element 12b, and a plurality of nanoscale reflectors 13. The substrate 10 includes a first surface 101 and a second surface (not shown) arranged oppositely on the two sides of the substrate 10.

The lead frame 11 is arranged on the first surface 101 of the substrate 10 including a carrier portion 111, a first connecting portion 112a, and a second connecting portion 112b. The carrier portion 111, the first connecting portion 112a, and the second connecting portion 112b are electrically insulating with each other. The lead frame 11 is made of copper or other electrically conductive metal and is not limited to the shape shown in this embodiment.

The first semiconductor lighting element 12a and the second semiconductor lighting element 12b are arranged on the carrier portion 111 of the lead frame 11 and electrically connecting to the carrier portion 111, the first connecting portion 112a, and the second connecting portion 112b separately by metal wires. The first semiconductor lighting element 12a and the second semiconductor lighting element 12b can emit light of the same or different wavelengths. The first semiconductor lighting element 12a and the second semiconductor lighting element 12b can be light emitting diodes, organic light emitting diodes, or laser diodes.

The plurality of nanoscale reflectors 13 is arranged separately on the first surface 101 of the substrate 10 and the lead frame 11 by electron beam lithography or photolithography. In this embodiment, a plurality of first nanoscale reflectors 13a is arranged on the first surface 101 of the substrate 10, a plurality of second nanoscale reflectors 13b is arranged on the carrier portion 111 of the lead frame 11, a plurality of third nanoscale reflectors 13c is arranged on the first connecting portion 112a of the lead frame 11, and a plurality of fourth nanoscale reflectors 13j is arranged on the second connecting portion 112b of the lead frame 11.

Figure 6:
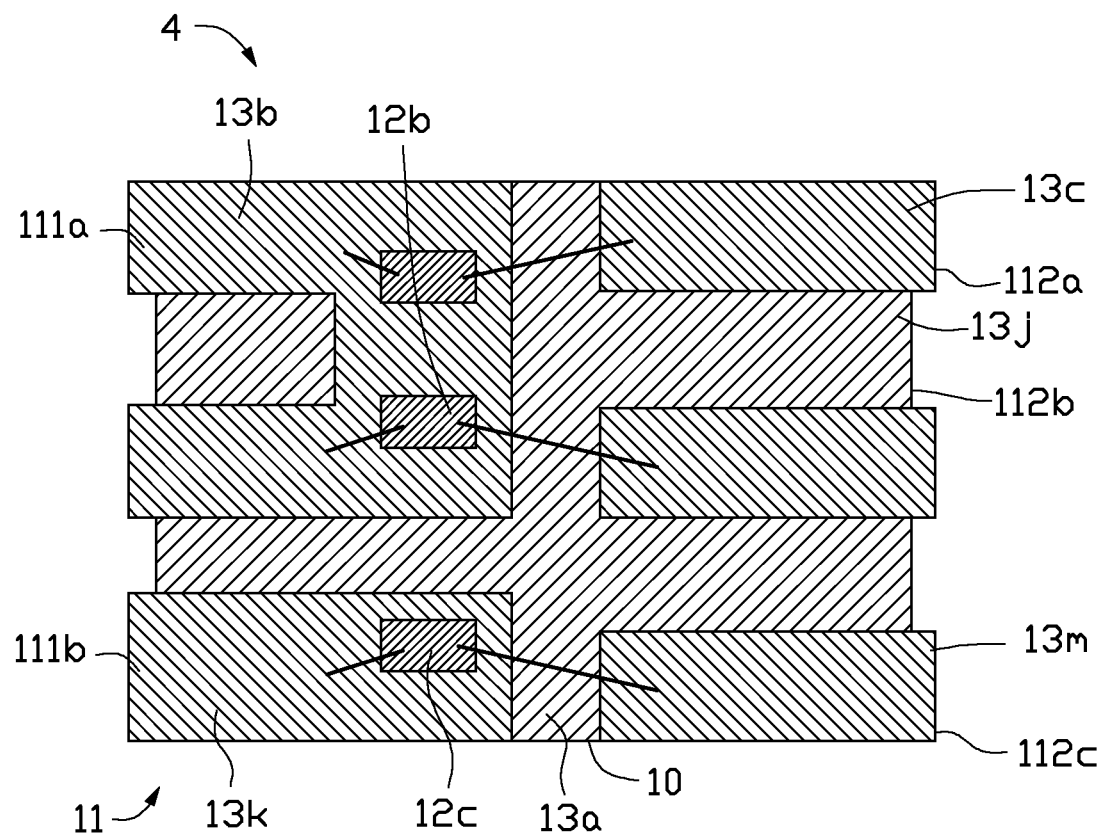
FIG. 6 is a view similar to FIG. 4B, showing a semiconductor lighting module package in accordance with a fourth embodiment.

Referring to FIG. 6, a semiconductor lighting module package 4 in accordance with a fourth embodiment includes a substrate 10, a lead frame 11, a first semiconductor lighting element 12a, a second semiconductor lighting element 12b, a third semiconductor lighting element 12c, and a plurality of nanoscale reflectors 13. The first semiconductor lighting element 12a and the second semiconductor lighting element 12b are arranged on the first carrier portion 111a of the lead frame 11. The third semiconductor lighting element 12c is arranged on the second carrier portion 111b of the lead frame 11. The semiconductor lighting elements 12a, 12b, 12c are electrically connecting to the carrier portions 111a, 111b and the connecting portions 112a, 112b, 112c separately by metal wires. In addition to the plurality of nanoscale reflectors 13a, 13b, 13c, 13j as mentioned above in FIG. 5, this embodiment further comprises a plurality of nanoscale reflectors 13m arranged on the third connecting portion 112c of the lead frame 11, and a plurality of nanoscale reflectors 13k arranged on the second carrier portion 111b of the lead frame 11. The semiconductor lighting elements 12a, 12b, and 12c can emit light of the same or different wavelengths.

Each of the embodiments mentioned above can further comprise a cover layer 14 covering the semiconductor lighting element 12 and partial lead frame 11 with material including silicon dioxide, epoxy, or other transparent material. The cover layer 14 can further include diffusion particles (not shown) for improving refraction of light. The cover layer 14 can be formed on the first surface 101 of the substrate 10 by transfer molding or injection molding. Furthermore, the cover layer 14 can further comprise at least one wavelength converting element 15 excited by light of a first wavelength and emitting light of a second wavelength. The wavelength converting element 15 can be YAG, TAG, aluminate, silicate, nitride, oxynitride, phosphide, sulfide, or a combination thereof. Taking the first embodiment of FIGS. 1A-1B as example, the wavelength converting elements 15 are excited by the light generated by the semiconductor lighting element 12 to generate a light having a wavelength different from that of the light generated by the semiconductor lighting element 12. Then the two lights with different wavelengths are mixed together to generate a desired light, for example, white light which is finally emitted from the semiconductor lighting module package 1.

It is to be understood, however, that even though numerous characteristics and advantages of the disclosure have been set forth in the foregoing description, together with details of the structures and functions of the embodiment(s), the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:
1. A semiconductor lighting module package, comprising:
   a substrate including a first surface and a second surface;
   a lead frame arranged on the first surface of the substrate with a carrier portion, a first connecting portion, and a second connecting portion, the carrier portion, the first connecting portion and the second connecting portion electrically insulated from each other;
   a first semiconductor lighting element and a second semiconductor lighting element arranged on the carrier por- tion and electrically connected to the first connecting portion and the second connecting portion separately; and a plurality of first nanoscale reflectors arranged on the first surface of the substrate, and a plurality of second nanoscale reflectors arranged on the carrier portion of the lead frame, a plurality of third nanoscale reflectors arranged on the first connecting portion of the lead frame, and a plurality of fourth nanoscale reflectors arranged on the second connecting portion of the lead frame;

wherein shapes of the plurality of the fourth nanoscale reflectors are different from shapes of the plurality of the first, second and the third nanoscale reflectors;

wherein a pitch between every two of the plurality of nanoscale reflectors has a distance which is less than a half wavelength of a visible light;

wherein the distance is between 90 nm and 130 nm; and wherein a gap between the every two of the plurality of nanoscale reflectors has a depth, and a ratio of the depth over the distance is not less than 2.

2. The semiconductor lighting module package as claimed in claim 1, wherein a shape of each of the nanoscale reflectors is selected from the group consisting of trapezoid, inverted trapezoid, elliptical, semicircular, rectangular, pyramidical and inverted pyramidical.

3. The semiconductor lighting module package as claimed in claim 1, wherein the plurality of nanoscale reflectors is metal.

4. The semiconductor lighting module package as claimed in claim 1, wherein a material for forming the substrate is selected from the group consisting of plastic, polymer, ceramic, silicon and metal.

5. The semiconductor lighting module package as claimed in claim 1, wherein the reflective index of the plurality of nanoscale reflectors exceeds the reflective index of the substrate and the lead frame.

6. The semiconductor lighting module package as claimed in claim 1 further comprising a cover layer on the first surface of the substrate covering the at least one semiconductor lighting element and a part of the lead frame.

7. The semiconductor lighting module package as claimed in claim 6, wherein the cover layer further comprises at least one wavelength converting element.

8. A semiconductor lighting module package, comprising:
a substrate including a first surface and a second surface;
a lead frame arranged on the first surface of the substrate with a carrier portion, a first connecting portion, and a second connecting portion, the carrier portion, the first connecting portion and the second connecting portion electrically insulated from each other;
a first semiconductor lighting element and a second semiconductor lighting element arranged on the carrier portion and electrically connected to the first connecting portion and the second connecting portion separately; and
a plurality of first nanoscale reflectors arranged on the first surface of the substrate, and a plurality of second nanoscale reflectors arranged on the carrier portion of the lead frame, a plurality of third nanoscale reflectors arranged on the first connecting portion of the lead frame, and a plurality of fourth nanoscale reflectors arranged on the second connecting portion of the lead frame;
wherein shapes of the plurality of the fourth nanoscale reflectors are different from shapes of the plurality of the first, second and the third nanoscale reflectors.

* * * * *